United States Patent
Kinzer et al.

[11] Patent Number: 5,940,721
[45] Date of Patent: Aug. 17, 1999

[54] TERMINATION STRUCTURE FOR SEMICONDUCTOR DEVICES AND PROCESS FOR MANUFACTURE THEREOF

[75] Inventors: Daniel M. Kinzer, El Segundo; Kenneth Wagers, Los Angeles, both of Calif.

[73] Assignee: International Rectifier Corporation, El Segundo, Calif.

[21] Appl. No.: 08/725,566

[22] Filed: Oct. 3, 1996

Related U.S. Application Data

[60] Provisional application No. 60/005,076, Oct. 11, 1995, and provisional application No. 60/006,688, Nov. 14, 1995.

[51] Int. Cl.$^6$ .................................................. H01L 21/76
[52] U.S. Cl. ........................... 438/454; 438/270; 438/279
[58] Field of Search ................................... 437/270, 268, 437/192, 195, 279, 454

[56] References Cited

U.S. PATENT DOCUMENTS

| | | | |
|---|---|---|---|
| 4,412,242 | 10/1983 | Herman et al. | 257/634 |
| 4,414,560 | 11/1983 | Lidow | 257/125 |
| 4,966,858 | 10/1990 | Masquelier et al. | |
| 5,113,230 | 5/1992 | Kinoshita et al. | |
| 5,240,872 | 8/1993 | Motonami et al. | |
| 5,304,831 | 4/1994 | Yilmaz et al. | 257/341 |
| 5,404,040 | 4/1995 | Hshieh et al. | 257/341 |
| 5,605,852 | 2/1997 | Bencuya | 438/270 |
| 5,644,148 | 7/1997 | Kinzer | 257/133 |

FOREIGN PATENT DOCUMENTS

| | | |
|---|---|---|
| 0037115 | 3/1981 | European Pat. Off. . |
| 0557253 | 8/1993 | European Pat. Off. . |
| 0635888 | 1/1995 | European Pat. Off. . |
| 0665595 | 8/1995 | European Pat. Off. . |
| 0671769 | 9/1995 | European Pat. Off. . |
| 4113962 | 4/1991 | Germany . |
| 2087648 | 5/1982 | United Kingdom . |
| 2127222 | 4/1984 | United Kingdom . |

*Primary Examiner*—Trung Dang
*Attorney, Agent, or Firm*—Ostrolenk, Faber, Gerb & Soffen, LLP.

[57] ABSTRACT

A termination structure for semiconductor devices and a process for fabricating the termination structure are described which prevent device breakdown at the peripheries of the device. The termination structure includes a polysilicon field plate located atop a portion of a field oxide region and which, preferably, overlays a portion of the base region. The field plate may also extend slightly over the edge of the field oxide to square off the field oxide taper. The termination structure occupies minimal surface area of the chip and is fabricated without requiring additional masking steps.

29 Claims, 4 Drawing Sheets

TERMINATION STRUCTURE FOR SEMICONDUCTOR DEVICES AND PROCESS FOR MANUFACTURE THEREOF

This application claims benefit of provisional application 60/005,076 filed Oct. 11, 1995 also Ser. No. 60/006,688 filed Nov. 14, 1995.

BACKGROUND OF THE INVENTION

The present invention relates to semiconductor devices and, more specifically, to a termination structure for semiconductor devices, such as MOS gate controlled ("MOS-gated") semiconductor devices.

MOS-gated devices are well known in the art and include devices such as the MOS-gated devices shown in U.S. patent application Ser. No. 08/299,533, filed Sep. 1, 1994 (IR-1113), the subject matter of which is incorporated herein by reference. MOS-gated devices also include power MOSFETS, MOS-gated thyristors, gate turn-off devices and the like.

The MOS-gated devices are typically formed of a plurality of active cells which include cells located at the periphery of the die. The peripheral cells, when subject to the full source-to-drain voltage, are prone to avalanche breakdown between the outermost portion of the cell and the adjacent street.

It is therefore necessary to provide a device structure that prevents breakdown at the active peripheries of the chip.

The manufacturing process for devices that include such structures includes a number of photolithographic masking steps and critical mask alignment steps each of which adds manufacturing time and expense as well as provides possible sources of device defects.

It is therefore also desirable to employ a termination structure that occupies a minimum surface area of the chip and does not require added masking steps.

SUMMARY OF THE INVENTION

The present invention provides for a termination structure that terminates the active peripheries of a semiconductor device to prevent breakdown at the peripheries of the device. A field plate is formed of the same polysilicon layer that forms the gate electrode and changes the curvature of the electric fields generated at the edge of the diffusion regions.

An aspect of the present invention relates to a termination structure for a semiconductor device and a process for fabricating the termination structure. A layer of field insulation material is formed atop a silicon substrate. One or more selected regions of the field insulation layer is patterned and etched away to form at least one opening and at least one remaining portion. A polysilicon layer is deposited in the openings and atop the remaining portions of the field insulation material layer, and selected portions of the polysilicon layer are patterned and etched away to form spaced openings. Each of the spaced openings has at least a first part formed in a respective opening of the field insulation material and is adjacent to the field insulation material. A portion of the polysilicon layer that is atop the field insulation layer defines a polysilicon field plate. First diffused regions are formed by introducing impurities of a first conductivity type into silicon substrate surface regions that are located beneath the first part of the openings in the polysilicon layer. Second diffused regions are formed of impurities of a second conductivity type, which is of opposite type to the first conductivity type, and are introduced into the silicon substrate surface regions. The first diffused regions are deeper and wider than the second diffused regions. An overlaying insulation layer is deposited, and then selected portions are patterned and etched away to expose underlying surface regions of the polysilicon field plate and underlying areas of the silicon substrate surface regions. A conductive layer is deposited over the insulation layer and over the underlying polysilicon field plate surface regions and the underlying silicon substrate surface regions. The conductive layer is etched to form one or more electrodes that contact the polysilicon field plate and one or more electrodes which contact the underlying areas of the silicon substrate surface regions.

In accordance with this aspect of the present invention, the polysilicon field plate may overlap the first diffused regions. A polysilicon finger may be formed in a region located between a respective pair of openings in the polysilicon layer. The width of the polysilicon finger may be sufficiently small such that the first diffused regions of a pair of openings overlap.

An opening in the field insulation material may surround the semiconductor device to form a street region, and an equipotential ring may be formed atop the field insulation material and the street region to hold the street region to a predefined potential.

The field insulation material may be isotropically etched to have a sloped edge, and impurities may be introduced through the sloped edge. A polysilicon field plate may extend over the sloped edge of the field insulation material.

The first conductivity type may be P-type and the second conductivity type may be N-type. Alternatively, the first conductivity type is N-type, and the second conductivity type is P-type. The polysilicon field plate may extend over an edge of the layer of field insulation material.

The openings in the polysilicon layer may include a second part that is formed atop the remaining portion of the layer of field insulation material. The field insulation material may be silicon dioxide, and the impurities of first and second conductivity type may be introduced by implanting the impurity into the silicon substrate and then driving in the impurity. The overlaying insulation layer may be a low-temperature oxide layer.

Another aspect of the present invention is a semiconductor device having the termination structure of the present invention and a process for fabricating the semiconductor device. The device and its fabrication process includes a layer of gate insulation material that is formed atop the silicon substrate in at least one opening in the layer of field insulation material. Spaced openings are formed in the polysilicon layer and include peripheral openings that have a first part formed atop the layer of gate insulation material and adjacent to the remaining field insulation material layer. Third diffused regions are also introduced into the silicon substrate surface regions. The second diffused regions have a final depth which is less than that of the third diffused regions, and the first diffused regions are deeper and wider than and have a lower concentration than the third diffused regions. Depressions are etched in the underlying areas of the silicon substrate surface regions and have a depth greater than the depth of the second diffused regions. Further portions of the silicon substrate surface are exposed adjacent to and surrounding the depressions in the underlying areas. The conductive layer comprises at least one gate contact which contacts the polysilicon field plate and at least one source contact which contacts the third diffused regions at the bottom of the depressions and the second diffused regions at the upper portions of the depressions and at the further portions.

In accordance with this aspect of the present invention, the gate insulation material may be silicon dioxide, and the polysilicon field plate may extend over a portion of the gate insulation layer.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

The present invention is directed to a termination structure and a fabrication process which can be used to terminate any type of semiconductor device. However, it is particularly applicable for use with a device and process such as that described in the aforementioned U.S. patent application Ser. No. 08/299,533.

Figure 1:
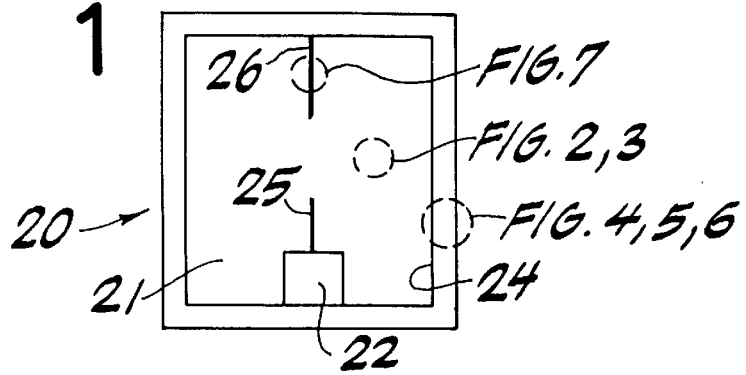
FIG. 1 shows a top view of an MOS-gated device according to an embodiment of the present invention.

FIG. 1 shows a top view of a MOSFET die 20, into which the termination structure of the present invention may be incorporated. The MOSFET die 20 may be a power MOSFET HEX 2.5 die as is sold by the International Rectifier Corporation of El Segundo, Calif. Typically, the die 20 has a dimension of 110×140 mils and has a source contact surface 21, a gate pad 22 and has gate busses 24, 25 and 26 extending therefrom. A drain contact (not shown) is located on the bottom of die 20.

Figure 3:
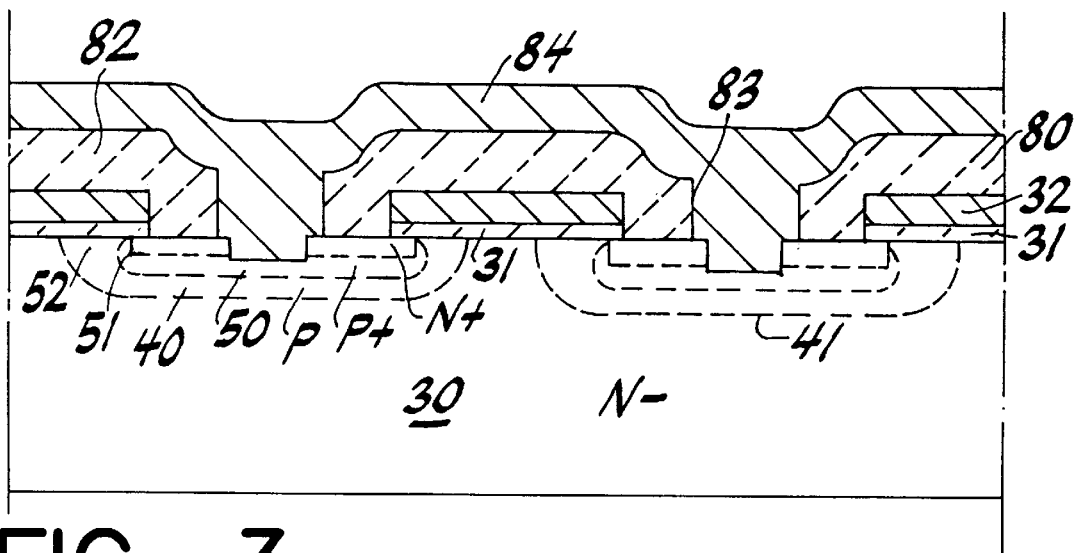
FIG. 3 shows a cross-sectional view of the MOS-gated device of FIG. 2 taken across section line 2—2.
Figure 2:
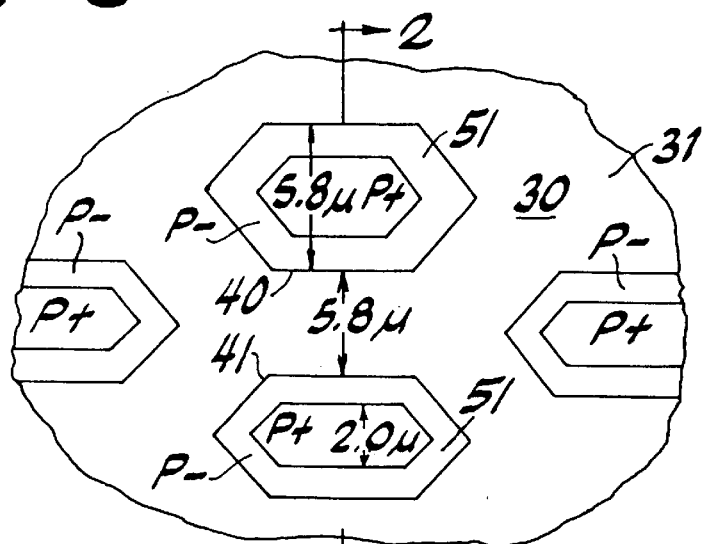
FIG. 2 shows the cell topology of the surface of a known MOS-gated device.

The device, however, can have any desired junction pattern that defines a desired MOS-gate controlled device. FIG. 2 and FIG. 3, which is a cross-section of FIG. 2 taken across section line 2—2, show a typical junction pattern which may be used as in the circled area of FIG. 1 labelled "FIGS. 2 and 3", namely that of aforementioned co-pending application Ser. No. 08/299,533. FIGS. 2 and 3 show a few of the parallel connected spaced hexagonal cellular MOSFET elements which are formed within an N$^-$ epitaxially formed region 30 and which include identical spaced P$^-$ base or channel diffusion regions 40 and 41 each of which contains an N$^+$ source regions 51 and a P$^+$ region 50 that is situated below the N$^+$ source regions. The invertible P$^-$ channel 52 is arranged beneath a gate oxide layer 31 and a polysilicon gate layer 32 shown in FIG. 3.

A low temperature oxide layer (LTO) 80, 82, 83 (LTO) overlies and insulates the segments of the gate polysilicon 32 to prevent the polysilicon 32 from connecting to the N$^+$ sources via the source metal (aluminum) 84.

The process that forms the junction pattern shown in FIGS. 2 and 3 is likewise described in the aforementioned co-pending application Ser. No. 08/299,533. According to an embodiment describe therein, the N– body 30 shown in FIG. 3 may be an epitaxial layer grown atop an N$^+$ substrate (not shown). A gate insulation layer 31 is formed atop the N– body 30 and may be a thermally grown silicon dioxide layer. The gate oxide layer 31 is then covered, in turn, by a layer of polysilicon 32.

A photoresist layer is then deposited atop the polysilicon layer and patterned using an appropriate photolithographic mask step. Openings are formed through the photoresist to the surface of the polysilicon layer 32. Following the formation of openings in the photoresist layer, an anisotropic etch is employed to etch the exposed portions of polysilicon. The etch is selective enough to remove the exposed polysilicon portions but stops prior to completely removing oxide anywhere on the wafer. Thereafter, the underlying exposed silicon dioxide may be removed, if desired, with an isotropic wet etch. However, it is also possible to leave the gate oxide mostly intact at this step in the process and subsequently implant dopants with sufficiently high energy to penetrate the gate oxide.

Thereafter, an implant is carried out through the windows in the polysilicon and employing boron as the implant species. Following this implant operation, the photoresist 33 is stripped and the P-type implants are driven in to form the P type regions 40 and 41. Then, a relatively high N$^+$ dose of arsenic or phosphorus is implanted through the polysilicon windows, and, subsequently, a P$^+$ dose of boron is implanted through the windows.

Thereafter, a layer of low temperature oxide ("LTO") 80, 82, 83 is deposited atop the surface of the wafer, and then the N$^+$ and P$^+$ implants are driven in to form regions 50 and 51. The N$^+$ layer 51 will be shallower than the P$^+$ layer 50 by an amount selected by the designer and determined by the species and doses used.

Another photoresist layer is then applied atop the LTO layer 80, 82, 83 and is patterned by a second mask step to form well-aligned small central openings located at the axis of each of the individual cells. The LTO layer 80, 82, 83 is then etched by an anisotropic oxide etch to open a central openings to the silicon surface.

Thereafter, another anisotropic etch etches the exposed silicon surface so that holes are formed in the silicon surface which penetrate the N$^+$ layers 51 and reach the P$^+$ layer 50 for each cell. The wafer is then exposed to an isotropic wet etch which undercuts the LTO layer 80, 82, 83. Then, the photoresist is stripped, and a source contact metal 84, such as aluminum, is deposited over the full surface of the device to fill in the openings in the LTO layer and the openings in the silicon substrate and to overlay the exposed silicon shoulders formed by the undercuts in the LTO layer. Thus, the source contact metal 84 connects the N$^+$ source regions to their respective underlying P$^+$ regions.

A drain (or anode) contact (not shown) may be connected to the N+ substrate and may be available for connection at either surface of the chip. If the device is to be made into an IGBT, a thin N+ buffer layer and P+ bottom layer is added to the bottom of the wafer structure in the conventional manner.

While the cells can have any desired dimensions, the cells shown in FIG. 3 typically have a width of about 5.8 microns and a typical separation of about 5.8 microns. The contact opening has a short dimension of, typically, about 2 microns. Each cell may be elongated, as shown, to a non-critical horizontal dimension.

While the above device is shown for an N-channel device, it will be apparent to those skilled in the art that the opposite conductivity types can be substituted for each region to make the device a P-channel device. The complete devices can also be mounted in a surface mount package or a non-surface mount package such as a T0220 package.

FIGS. 4–7 show an embodiment of a novel termination structure that is suitable for either N or P channel devices and which can be manufactured using the same process steps that is used to make the cells shown in FIGS. 2 and 3.

Figure 4:
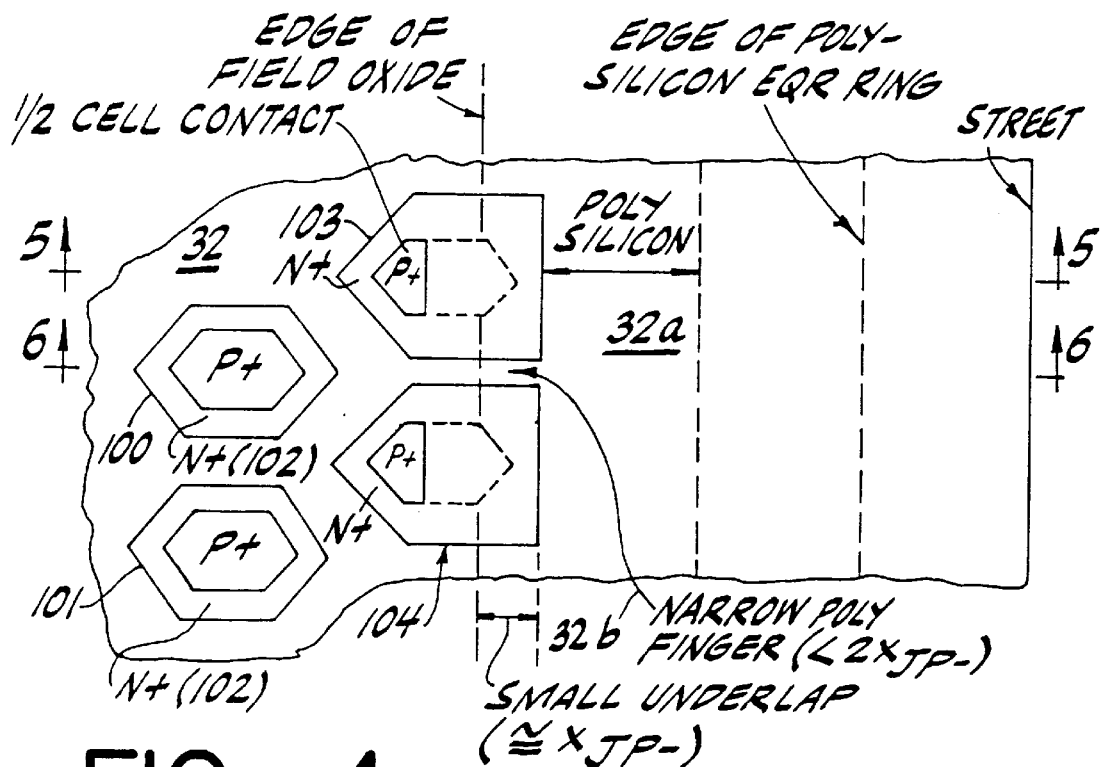
FIG. 4 shows the cell topology of a portion of the outermost active cells and the termination region of the MOS-gated device of FIG. 1.
Figure 5:
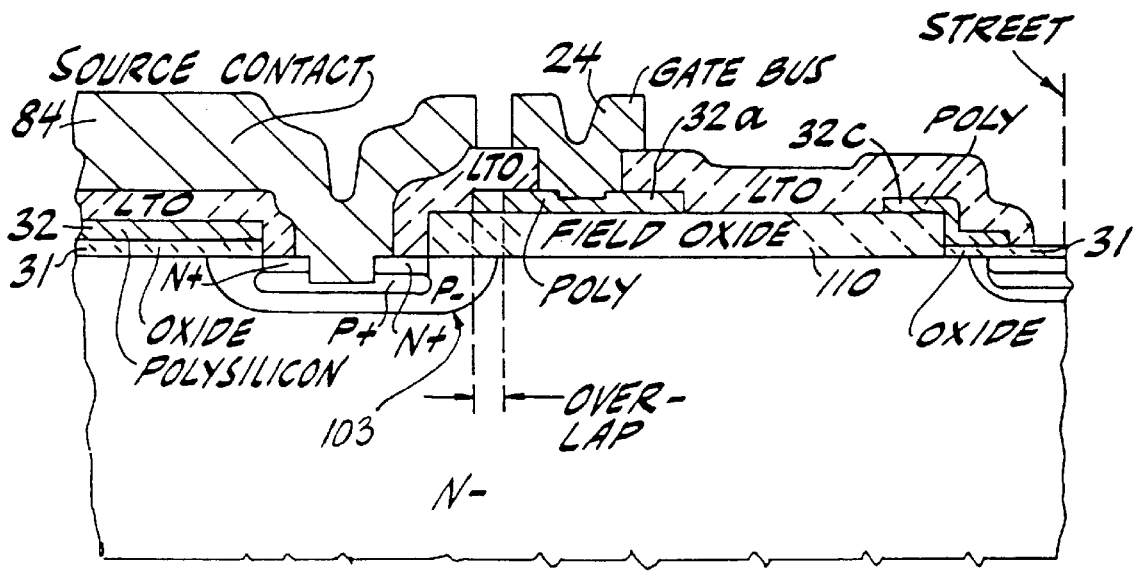
FIG. 5 shows a cross-sectional view of the MOS-gated device of FIG. 4 taken across section line 5—5.
Figure 6:
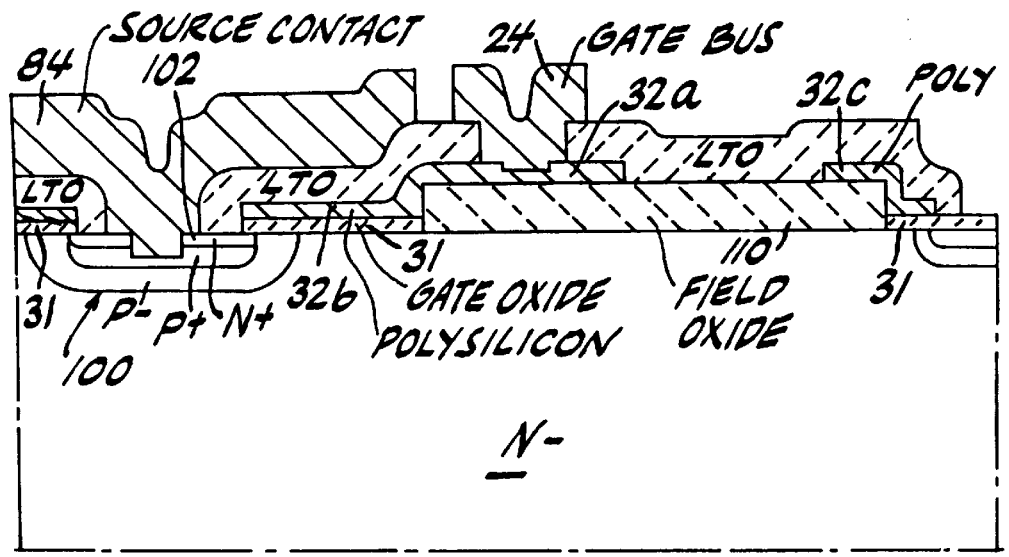
FIG. 6 shows a cross-sectional view of the MOS-gated device of FIG. 4 taken across section line 6—6.

The circled area of FIG. 1, labeled "FIGS. 4, 5 and 6" comprises the termination structure of gate bus 24 of FIG. 1. The circled area of FIG. 1 labeled "FIG. 7" comprises the termination structure of gate bus 25 and 26.

Referring first to FIG. 4, two of the last or outermost complete active area cells 100 and 101 are shown. FIG. 4 shows these cells with the top of the polysilicon layer 31 exposed so that the N+ source 102 and P+ layers of the cells are shown. The active area cells 100 and 101 are shown in FIG. 6 in a cross section view of FIG. 4 taken along line 6—6. FIG. 6, however, also shows the overlaying low temperature oxide layer as well as source contact 84 and gate bus 24.

The active cells 100 and 101 are adjacent to terminating half cells 103 and 104, shown in FIGS. 4 and 5, which are formed during the same process steps which form cells 100 and 101. FIG. 5 is a cross-section view of FIG. 4 taken along line 5—5.

A field oxide layer 110, shown in FIGS. 5 and 6, is formed atop the N-type body prior to the process described in the aforementioned application Ser. No. 08/299,533. A photoresist layer is deposited atop the field oxide and then patterned using an appropriate photolithographic mask step to form openings to the field oxide layer. The exposed portions of the field oxide are then etched away to expose the active device areas. Preferably, an isotropic wet etch is employed to cause the edges of the field oxide to have a tapered profile. However, an anisotropic etch process may also be used. The gate oxide layer is then grown atop the active device areas, and a polysilicon layer is then deposited over the gate oxide and field oxide layers. The device is then processed in the manner described above.

The field oxide layer 110 serves as an insulation layer between the gate bus and the silicon substrate. The edge of the field oxide 110 also combines with the edge of the active area polysilicon to serve as a diffusion window to define the P−, N+ and P+ portions of the terminating half cells 103 and 104 which, in part, underlie the field oxide 110. The top surface of field oxide 110 is also partially covered with a polysilicon strip 32a which is deposited and patterned in the same process steps as the active area main polysilicon gate 32.

As shown in FIG. 6, narrow fingers 32b of the polysilicon layer extend from the main web 32 of the polysilicon layer and connect to the strip 32a. The width of the fingers should be minimized to allow the P− regions to diffuse together under fingers 32b and form an uninterrupted region at the edge of the chip (2 μm in width for example). Wider separations result in lower avalanche voltage. The strip 32a is, in turn, connected to the gate bus 24 which is simply an isolated strip of the same metal layer that is deposited to form the source contact 84.

The LTO layer shown in FIGS. 5 and 6 is deposited at the same time as the LTO layer 80, 82, 83 in FIG. 3. An equipotential ring of polysilicon (EQR ring) 32C is also formed during the formation of the active area polysilicon 32 but overlies the edge of the field oxide 110 as shown. The EQR ring also contacts the gate oxide layer located atop the region adjacent to the street to prevent formation of an inversion channel, which can cause leakage current. It is connected to the street region which is typically at the drain potential.

Figure 7:
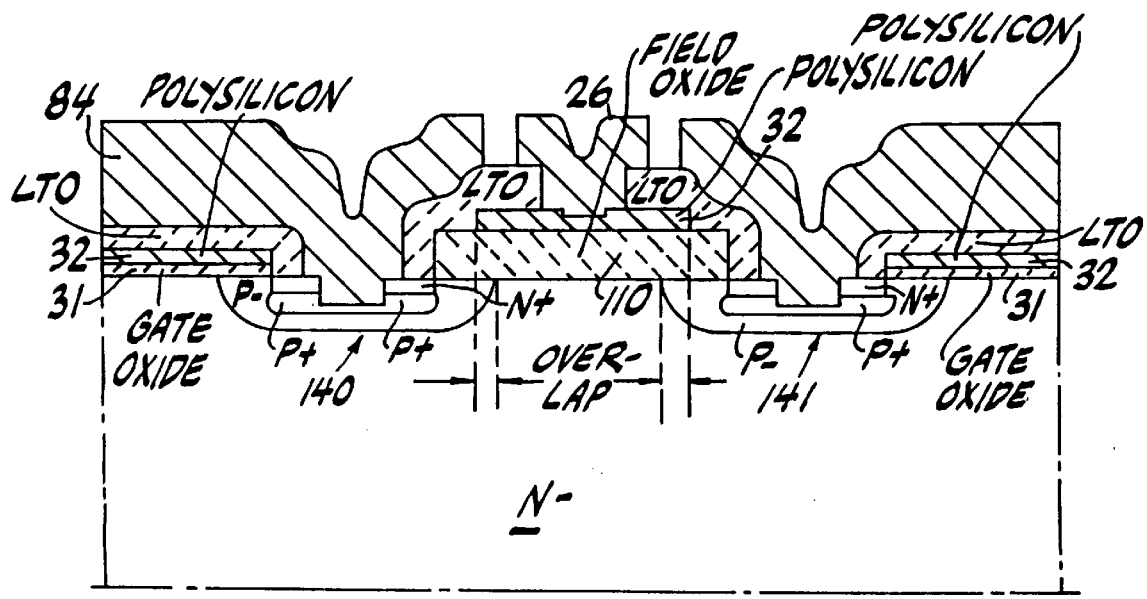
FIG. 7 shows a cross-sectional view of a region of the MOS-gated device of FIG. 1 which includes a center gate bus.

FIG. 7 shows the manner in which the termination structure of FIGS. 4, 5 and 6 can be applied to the terminating half cells that are adjacent to the gate bus 25 or 26 located at the interior of the die. Thus, terminating half cells 140 and 141, which are similar to cells 103 and 104 shown in FIGS. 4 and 5, are terminated by a structure similar to the left-hand symmetric side, relative to bus 24, in FIGS. 5 and 6.

In accordance with an important feature of the invention, and as shown in FIGS. 5 and 7, the polysilicon plate 32a should be close to, and optimally overlies, the edge of the P− base region of the terminal cells 103, 104 or 140, 141. The polysilicon acts as a field plate to spread out the electric field produced at the edge cells. A separation of several microns between the edge of the P− base region and the field plate is still acceptable, but will result in decreasing breakdown voltage as the separation increases.

Figure 8:
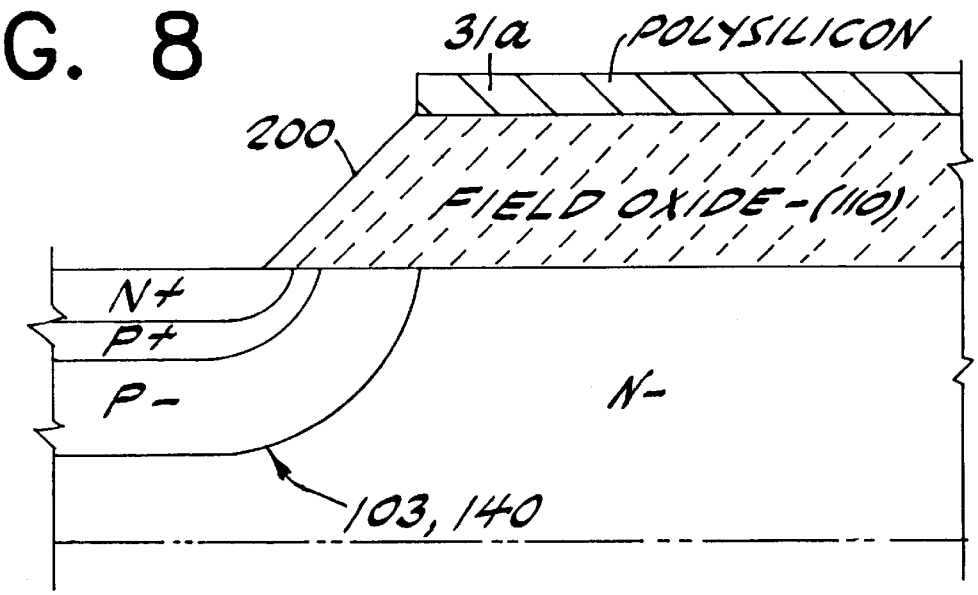
FIG. 8 shows an enlarged view of the gate oxide step portion of the region shown in FIG. 7.

FIG. 8 shows an enlarged view of the edge region of the field oxide 110. As described above, the field oxide is preferably isotropically etched and the edge of the field oxide thus has a tapered profile. This taper 200 in the field oxide is advantageous for N-channel devices because the deep implanted P+ region is partially implanted through the taper and surrounds the source to reach the surface. The taper also widens the profile of the P− region that is also partially implanted through the taper. These profiles of the P− and P+ regions prevent channel leakage and reduces the base resistance of the edge cells.

Figure 9:
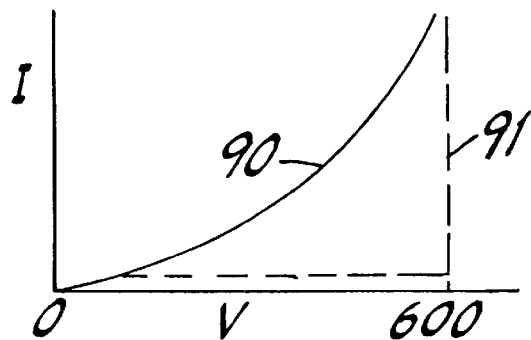
FIG. 9 is a diagram showing the I-V breakdown characteristics of a known P-channel device and of a P-channel device according to an embodiment of the present invention.

As noted above, the termination structure of the present invention is also applicable to P-channel devices. More specifically, a P+ source region is substituted for the N+ source region shown in FIG. 8, an N+ region is substituted for the P+ region, an N− base region substituted for the P− base region, and a P type substrate is used. When the termination structure is used with P-channel devices, however, it has been found that the P-channel device has a "soft" I-V breakdown characteristic shown by curve 90 in FIG. 9. The soft breakdown characteristic is caused in part by the abrupt corner formed by the intersection of the polysilicon and field oxide masks. This reduces the peak doping concentration of the N− base region at the corners, which in turn leads to premature punch-through breakdown. This effect is further strengthened by the oxide taper, which allows the implanted P+ source region to extend further under the oxide.

Figure 10:
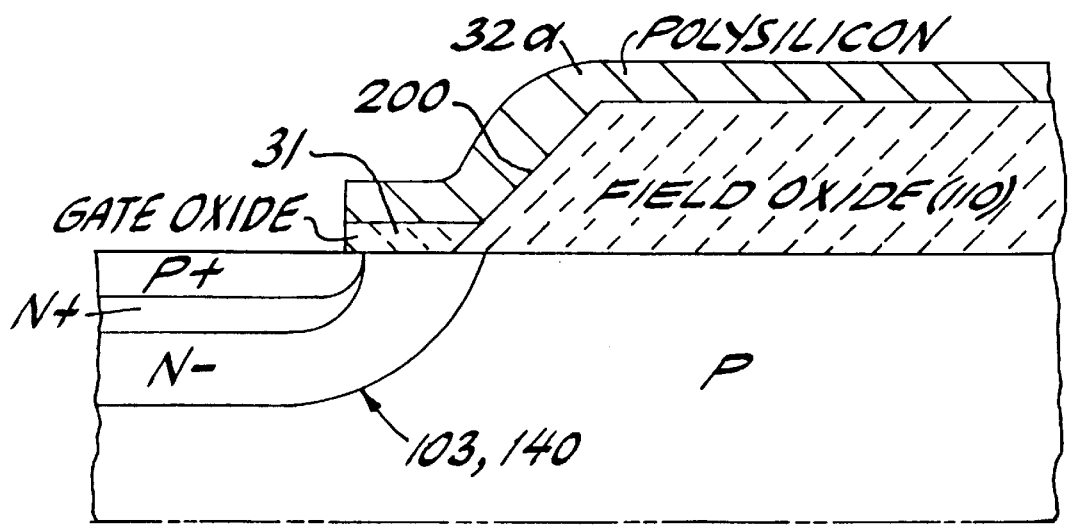
FIG. 10 shows an enlarged view of a gate oxide step portion of an P-channel device according to an embodiment of the invention.

To address the problem, and in accordance with another aspect of the present invention, the polysilicon layer 32a is caused to extend slightly over the edge of the field oxide 110 (by about 0.5 micron) to "square" off the shoulder of the field oxide taper 200 as shown in FIG. 10. Though a P⁻ channel device is shown, the polysilicon extension is also advantageous to N⁻ channel devices. The polysilicon extension also masks the introduction of dopants into the substrate for the portion of the cell shown. It has been found that this design prevents the soft breakdown, particularly for P channel devices, and causes a more square breakdown characteristic shown by the dotted curve 91 in FIG. 9.

The polysilicon extension may range from zero to several microns but, optimally, should be as small as design rules allow because longer extensions lead to high field stress at the step from gate oxide to field oxide. This stress can reduce reliability of the termination due to hot carrier injection and time-dependent dielectric breakdown. It also causes a "walkout" I-V characteristic, where the device avalanches at a reduced voltage and then increases gradually as carriers are injected and trapped in the oxide at the stress point.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a termination structure of a semiconductor device, said process comprising the steps of:

forming a layer of field insulation material atop a silicon substrate;

patterning and etching away at least one selected region of said layer of field insulation material to form at least one opening in said layer of field insulation material and at least one remaining portion;

depositing a layer of polysilicon in said at least one opening in said layer of field insulation material and atop said remaining portion of said layer of field insulation material;

patterning and etching away selected portions of said layer of polysilicon to form a plurality of spaced openings in said layer of polysilicon each having at least a respective first part formed in said at least one opening of said layer of field insulation material and adjacent to said remaining portion of said layer of field insulation material, a portion of said layer of polysilicon that is atop said layer of field insulation material defining a polysilicon field plate;

introducing impurities of a first conductivity type into corresponding surface regions of said silicon substrate located beneath said respective first part of said plural openings in said layer of polysilicon to form first diffused regions;

introducing impurities of a second conductivity type which is of opposite conductivity type to said first conductivity type into said corresponding surface regions of said silicon substrate to form second diffused regions, said first diffused regions being deeper and wider than said second diffused regions;

depositing an overlaying insulation layer;

patterning and etching away selected portions of said overlaying insulation layer to form first openings therein which expose underlying surface regions of said polysilicon field plate and second openings which expose respective underlying areas of said surface regions of said silicon substrate;

depositing a conductive layer over said overlaying insulation layer and over said underlying surface regions of said polysilicon field plate and said underlying areas of said surface regions of said silicon substrate; and patterning and etching away portions of said conductive layer to form at least one electrode which contacts said polysilicon field plate and at least one electrode which contacts said underlying areas of said surface regions of said silicon substrate.

2. The method of claim 1 wherein a portion of said polysilicon field plate overlies a portion of said first diffused regions.

3. The method of claim 1 wherein a region of said polysilicon layer located between a respective pair of said spaced openings forms a polysilicon finger.

4. The method of claim 3 wherein the width of said polysilicon finger is sufficiently small such that the first diffused region of one of said respective pair of spaced openings overlaps the first diffused region of another one of said pair of respective spaced openings.

5. The method of claim 1, wherein said layer of field insulation material includes a second opening that borders said semiconductor device and forms a street region, and said layer of polysilicon includes an equipotential ring having a first portion located atop said layer of field insulation material and a second portion located atop said street region to maintain said street region at a predetermined potential.

6. The method of claim 1, wherein said step of patterning and etching said layer of field insulation material includes isotropically etching said field insulation material such that an edge of said layer of field insulation material that borders said first part of said plurality of spaced openings has a sloped profile.

7. The method of claim 6, wherein said steps of introducing impurities of a first and second conductivity type includes introducing said impurities through said sloped edge in said layer of field insulation material.

8. The method of claim 6, wherein said polysilicon field plate extends over said sloped edge in said layer of field insulation material.

9. The method of claim 1 wherein said first conductivity type is P-type and said second conductivity type is N-type.

10. The method of claim 1, wherein said first conductivity type is N-type, and said second conductivity type is P-type.

11. The method of claim 1, wherein said polysilicon field plate extends over an edge of said layer of field insulation material that adjoins said first part of said spaced openings in said layer of polysilicon.

12. The method of claim 1, wherein each of said plurality of spaced openings include a respective second part formed atop said remaining portion of said layer of field insulation material.

13. The method of claim 1, wherein said field insulation material is silicon dioxide.

14. The method of claim 1, wherein said steps of introducing impurities of said first and second conductivity type includes implanting each of said impurities into said silicon substrate and then driving in said impurities.

15. The method of claim 1, wherein said overlaying insulation layer is a low temperature oxide layer.

16. A process for fabricating a semiconductor device having a termination structure, said process comprising the steps of:

forming a layer of field insulation material atop a silicon substrate;

patterning and etching away at least one selected region of said layer of field insulation material to form at least one opening in said layer of field insulation material and at least one remaining portion;

forming a layer of gate insulation material atop said silicon substrate in said at least one opening in said layer of field insulation material;

depositing a layer of polysilicon atop said remaining portion of said layer of field insulation material and said layer of gate insulation material;

patterning and etching away selected portions of said layer of polysilicon to form a plurality of spaced openings in said layer of polysilicon that include a plurality of peripheral openings each having at least a respective first part formed atop said layer of gate insulation material and adjacent to said remaining portion of said layer of field insulation material, a portion of said layer of polysilicon that is atop said layer of field insulation material thereby defining a polysilicon field plate;

introducing impurities of a first conductivity type into surface regions of said silicon substrate located beneath said respective first part of said peripheral openings in said layer of polysilicon to form first diffused regions;

introducing impurities of a second conductivity type which is of opposite conductivity type to said first conductivity type into said corresponding surface regions of said silicon substrate to form second diffused regions;

introducing impurities of said first conductivity type into said surface regions of said silicon substrate to form third diffused regions; said second diffused regions having a final depth that is less than that of said third diffused regions, said first diffused regions being deeper and wider than and having a lower concentration than that of said third diffused regions;

depositing an overlaying insulation layer;

patterning and etching away selected portions of said overlaying insulation layer to form first openings in said overlaying insulation layer which expose underlying surface regions of said polysilicon field plate and second openings which expose respective underlying areas of said surface regions of said silicon substrate and having side walls;

etching depressions in said underlying areas of said surface regions of said silicon substrate to a depth greater than the depth of said second diffused regions;

etching said side walls to form undercut portions which expose further portions of the surface of said silicon substrate which are adjacent to and which surround said depressions in said underlying areas of said surface regions of said silicon substrate;

depositing a conductive layer over said overlaying insulation layer and over said underlying surface regions of polysilicon field plate, said third diffused regions at the bottom of said depressions, and said second diffused regions at the upper portions of said depressions and at said further portions of the surface of said silicon substrate; and patterning and etching away portions of said conductive layer to form at least one gate contact which contacts said polysilicon field plate and at least one source contact which contacts said second and third diffused regions.

17. The method of claim 16 wherein a portion of said polysilicon field plate overlies a portion of said first diffused regions.

18. The method of claim 16 wherein a region of said polysilicon layer located between a respective pair of said peripheral openings forms a polysilicon finger.

19. The method of claim 18 wherein the width of said polysilicon finger is sufficiently small such that the first diffused region of one of said respective pair of peripheral openings overlaps the first diffused region of another one of said pair of respective peripheral openings.

20. The method of claim 16, wherein said layer of field insulation material includes a second opening that borders said semiconductor device and forms a street region, and said layer of polysilicon includes an equipotential ring having a first portion located atop said layer of field insulation material and a second portion located atop said street region to maintain said street region at a predetermined potential.

21. The method of claim 16, wherein said step of patterning and etching said layer of field insulation material includes isotropically etching said field insulation material such that an edge of said layer of field insulation material that borders said first part of said plurality of peripheral openings has a sloped profile.

22. The method of claim 21, wherein said steps of introducing impurities of a first and second conductivity type includes introducing said impurities through said sloped edge in said layer of field insulation material.

23. The method of claim 21, wherein said polysilicon field plate extends over said sloped edge in said layer of field insulation material.

24. The method of claim 16 wherein said first conductivity type is P-type and said second conductivity type is N-type.

25. The method of claim 16, wherein said first conductivity type is N-type, and said second conductivity type is P-type.

26. The method of claim 25, wherein said polysilicon field plate extends over an edge of said layer of field insulation material that adjoins said first part of said spaced openings in said layer of polysilicon.

27. The method of claim 16, wherein each of said plurality of spaced openings include, a respective second part formed atop said remaining portion of said layer of field insulation material.

28. The method of claim 16, wherein said layer of gate insulation material is silicon dioxide.

29. The method of claim 26, wherein said polysilicon field plate further extends over a portion of said layer at gate insulation material.

* * * * *